United States Patent
Nistler et al.

(10) Patent No.: US 10,761,160 B2
(45) Date of Patent: Sep. 1, 2020

(54) ADJUSTING A FIELD DISTRIBUTION OF AN ANTENNA ARRANGEMENT OF A MAGNETIC RESONANCE SYSTEM

(71) Applicant: Siemens Healthcare GmbH, Erlangen (DE)

(72) Inventors: Jürgen Nistler, Erlangen (DE); Razvan Lazar, Baiersdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/281,080

(22) Filed: Feb. 20, 2019

(65) Prior Publication Data
US 2019/0257899 A1 Aug. 22, 2019

(30) Foreign Application Priority Data
Feb. 21, 2018 (EP) .................................... 18157877

(51) Int. Cl.
*G01V 3/00* (2006.01)
*G01R 33/36* (2006.01)
(Continued)

(52) U.S. Cl.
CPC ......... *G01R 33/3664* (2013.01); *G01R 33/10* (2013.01); *G01R 33/34076* (2013.01);
(Continued)

(58) Field of Classification Search
USPC ........................................................ 324/309
See application file for complete search history.

(56) References Cited

U.S. PATENT DOCUMENTS

| 5,081,418 A | 1/1992 | Hayes |
| 6,781,378 B2 | 8/2004 | Eberler |
(Continued)

FOREIGN PATENT DOCUMENTS

| DE | 102006018158 A1 | 10/2007 |
| DE | 102008062547 A1 | 7/2010 |
(Continued)

OTHER PUBLICATIONS

European Search Report for corresponding Application No. 18157877.4-1022 filed Sep. 17, 2018.

*Primary Examiner* — Rodney E Fuller
(74) *Attorney, Agent, or Firm* — Lempia Summerfield Katz LLC

(57) ABSTRACT

A method for adjusting a field distribution of an antenna arrangement of a magnetic resonance system is provided. The symmetry of the field distribution may be impaired by positional inaccuracy of the antenna arrangement in the magnetic resonance system. The antenna arrangement comprises oscillating circuit antenna elements and switching elements. Each of the oscillating circuit antenna elements is assigned a respective switching element of the switching elements. A respective switching element is configured to couple the assigned oscillating circuit antenna element operatively to the antenna arrangement in dependence on a status of the respective switching element. During the method, symmetry information on the field distribution in the antenna arrangement is measured, and the switching elements are automatically adjusted using the measured symmetry information, such that the symmetry of the field distribution in the interior of the antenna arrangement is increased.

18 Claims, 6 Drawing Sheets

(51) Int. Cl.
*G01R 33/10* (2006.01)
*G01R 33/34* (2006.01)
*G01R 33/58* (2006.01)
*G01R 33/565* (2006.01)
*G01R 33/422* (2006.01)

(52) U.S. Cl.
CPC ....... *G01R 33/5659* (2013.01); *G01R 33/583* (2013.01); *G01R 33/34046* (2013.01); *G01R 33/422* (2013.01)

(56) References Cited

U.S. PATENT DOCUMENTS

| | | |
|---|---|---|
| 8,072,218 B2 | 12/2011 | Nistler |
| 8,362,775 B2 | 1/2013 | Nistler |
| 2007/0247158 A1 | 10/2007 | Nistler |
| 2009/0128150 A1 | 5/2009 | Ham |
| 2009/0201019 A1 | 8/2009 | Zhai |
| 2010/0188086 A1 | 7/2010 | Lazar |
| 2013/0021033 A1 | 1/2013 | Stoeckel |
| 2013/0165768 A1 | 6/2013 | Biber |
| 2013/0300418 A1 | 11/2013 | Eberler |
| 2016/0363640 A1 | 12/2016 | Garcia |
| 2016/0377557 A1* | 12/2016 | Kimura ............ G01N 22/00 324/638 |
| 2017/0016969 A1 | 1/2017 | Eberler |
| 2018/0003787 A1 | 1/2018 | Cloos |

FOREIGN PATENT DOCUMENTS

| | | |
|---|---|---|
| DE | 102011089448 A1 | 6/2013 |
| DE | 102012207722 B3 | 8/2013 |
| WO | WO2007124246 A1 | 11/2007 |

* cited by examiner

ADJUSTING A FIELD DISTRIBUTION OF AN ANTENNA ARRANGEMENT OF A MAGNETIC RESONANCE SYSTEM

This application claims the benefit of EP 18157877.4, filed on Feb. 21, 2018, which is hereby incorporated by reference in its entirety.

BACKGROUND

The present embodiments relate to adjusting a field distribution of an antenna arrangement of a magnetic resonance system.

In magnetic resonance (MR) systems, antenna arrangements may be used to generate a radio-frequency field (e.g., a B1 field). Such antenna arrangements may, for example, have a cylindrical or tubular structure arranged around a patient receiving bore of the magnetic resonance system. Examples of antenna arrangements (e.g., body coils) are described in the publications U.S. Pat. Nos. 8,362,775 B2, 6,781,378 B2, 8,072,218 B2, and US 20170016969 A1.

Alternatively, such an antenna arrangement may also be provided in conjunction with a local coil. The antenna arrangement may include an actual antenna (e.g., a birdcage antenna or a transverse electromagnetic (TEM) resonator (e.g., TEM antenna) and a radio-frequency (RF) screen in order to provide a defined environment for the field generation. The decisive factor for optimal operation of the antenna arrangement is the interaction between the antenna and the RF screen in order, for example, to achieve a symmetrical or homogeneous field distribution. Herein, the distance between the antenna and the RF screen is to be maintained as exactly as possible. However, practical implementations of such antenna arrangements are based on a mechanical separation of the antenna and RF screen and so adjustment elements are to be provided to compensate the tolerances present.

In addition to mechanical adjustment elements, adjustable capacitors (e.g., trim capacitors) may be provided in order to compensate these mechanical tolerances and to improve (e.g., homogenize) the field distribution or increase field symmetry. However, adjustments of this kind are very time consuming and hence costly. During operation of the magnetic resonance system, the homogeneous or symmetrical field distribution of the B1 field emitted by the antenna arrangement may also, for example, be influenced by the patient to be examined.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the field distribution of an antenna arrangement of a magnetic resonance system under the above-described conditions is improved.

The present embodiments provide a method for adjusting a field distribution of an antenna arrangement of a magnetic resonance system. A symmetry of the field distribution may be impaired by positional inaccuracy of the antenna arrangement in the magnetic resonance system. For example, a symmetry of the field distribution may be impaired by a positional inaccuracy of the antenna arrangement relative to a radio-frequency (RF) screen. An impairment of the symmetry of the field distribution may, for example, include an impairment of the homogeneity of the field distribution in the interior of the antenna arrangement. The antenna arrangement includes multiple oscillating circuit antenna elements and multiple switching elements. Each oscillating circuit antenna element out of the multiple oscillating circuit antenna elements is assigned a respective switching element out of the multiple switching elements. A respective switching element is embodied to couple the assigned oscillating circuit antenna element operatively to the antenna arrangement or to decouple the assigned oscillating circuit antenna from the antenna arrangement in dependence on a switching status of the switching element. Hence, the combination of an oscillating circuit antenna element and the assigned switching element may be considered to be a switchable oscillating circuit antenna element.

The antenna arrangement may, for example, include an antenna with a birdcage structure. A birdcage structure includes a number of equidistant longitudinal antenna rods extending in parallel arranged on a cylinder-like surface. These longitudinal antenna rods are in each case connected in terms of radio frequency to one another at the ends by antenna ferrules. In this context, a "connection in terms of radio frequency" provides that the connection does not necessarily have to be a galvanic connection but only that a connection transparent to radio-frequency current is provided. The switchable oscillating circuit antenna elements may, for example, be arranged between galvanically isolated sections of the ferrules. Alternatively, the switchable oscillating circuit antenna elements may, for example, be arranged parallel to one of the longitudinal rods.

In the method, the symmetry information on the field distribution in the antenna arrangement is measured. For example, it is, for example, possible for the symmetry information on the field distribution in the interior of the antenna arrangement to be measured. For example, in the case of an antenna arrangement with a birdcage structure, the symmetry information on the field distribution within the cylindrical surface bounded by the longitudinal rods may be measured. The measured symmetry information is used for the automatic adjustment of the multiple switching elements such that the symmetry of the field distribution in the interior of the antenna arrangement is increased.

The use of switching elements enables the adjustment or adaptation of the antenna arrangement to be automated in a simple manner. An automatic controller may, for example, drive different switch combinations for the multiple switching elements using a suitable method, thus optimizing the field distribution. For example, a gradient descent method may be used for this, or it is possible to try out numerous or all possible switch combinations and thus determine the best possible field distribution. Hence, the switchable oscillating circuit antenna elements may compensate mechanical tolerances resulting from the interaction between the antenna and the radio-frequency screen. Likewise, during the operation of the magnetic resonance system, it is possible to compensate the influence of a patient on the field distribution within the antenna arrangement.

As described above, the positional inaccuracy of the antenna arrangement may include a positional inaccuracy of an arrangement of the antenna arrangement relative to a radio-frequency screen. This positional inaccuracy of the arrangement of the antenna arrangement relative to the radio-frequency screen may impair the symmetry of the field distribution in the interior of the antenna arrangement. The adjustment of the multiple switching elements such that the symmetry of the field distribution in the interior of the antenna arrangement is increased at least partially compensates the effects of the positional inaccuracy.

In one example, the measurement of the symmetry information includes the measurement of a resonant frequency of the antenna arrangement. Resonant frequencies and the decoupling thereof may depend on symmetry properties of the field distribution in the antenna arrangement. The multiple switching elements are adjusted using the resonant frequency such that the symmetry of the field distribution in the interior of the antenna arrangement is increased (e.g., the multiple switching elements are adjusted such that one or more specific (desired) resonant frequencies and the decoupling thereof occur). The resonant frequency of the antenna arrangement may, for example, be determined when a radio-frequency signal is fed into the antenna arrangement and is hence available in a simple manner as a measure of the symmetry or homogeneity of the field distribution.

In a further example, the measurement of the symmetry information includes the measurement of a B1 field in the antenna arrangement. The multiple switching elements are adjusted using the B1 field measurement such that the symmetry of the field distribution in the interior of the antenna arrangement is increased. The measurement of the B1 field may, for example, be performed by corresponding sensors at suitable locations in the interior of the antenna arrangement. This, for example, enables homogeneity or symmetry to be provided in different particularly relevant regions.

In yet a further example, the measurement of the symmetry information includes the measurement of a current distribution in the antenna arrangement. The multiple switching elements are adjusted using the current distribution such that the symmetry of the field distribution in the interior of the antenna arrangement is increased. The current distribution in the antenna arrangement may, for example, be performed with suitable current sensors (e.g., pick-up coils). The current sensors may, for example, be assigned to the switching elements. Alternatively or additionally, the current sensors may be assigned to individual elements of the ferrules or the longitudinal rods of an antenna with a birdcage structure. The current sensors may be arranged in regions of galvanic isolation between individual elements of the ferrules.

The current distribution represents an indicator for the homogeneity or symmetry of the field distribution of the radio-frequency field generated by the antenna arrangement and is hence suitable for controlling the switching elements.

One oscillating circuit antenna element out of the multiple oscillating circuit antenna elements may, for example, include a capacitor. The capacitor is coupled to the antenna arrangement by the assigned switching element in order to change the capacitance of the antenna arrangement in order to increase the symmetry or homogeneity of the field distribution in the antenna arrangement. For example, a capacitor may be arranged in series with the assigned switching element between two galvanically isolated elements of a ferrule in order to increase the capacitive coupling between the galvanically isolated elements of the ferrule in dependence on the switching status of the switching element. Depending on the asymmetry or inhomogeneity of the field distribution, increasing the capacitive coupling in this way may improve the symmetry or homogeneity of the field distribution.

Alternatively or additionally, one oscillating circuit antenna element out of the multiple oscillating circuit antenna elements may, for example, include an inductive element. The inductive element is coupled to the antenna arrangement by the assigned switching element in order to change the inductance of the antenna arrangement in order to increase the symmetry or homogeneity of the field distribution. For example, a series circuit consisting of the inductive element and the assigned switching element may be arranged parallel to one of the longitudinal rods of an antenna with a birdcage structure. This arrangement enables the inductance of the longitudinal rod to be increased in dependence on the switching status of the switching element. Increasing the inductance is this way may improve the symmetry or homogeneity of the field distribution.

In a further example, the multiple switching elements may be switched independently of one another. This enables precise adjustment of the field distribution and hence the compensation of positional inaccuracy or other asymmetries or inhomogeneities of the field distribution.

According to the present embodiments, an antenna arrangement for a magnetic resonance system is provided. A symmetry of a field distribution of the antenna arrangement may be impaired by positional inaccuracy of the antenna arrangement in the magnetic resonance system. The antenna arrangement includes multiple oscillating circuit antenna elements, multiple switching elements, and a control apparatus that is coupled to the multiple switching elements in order to drive the switching elements. Each oscillating circuit antenna element out of the multiple oscillating circuit antenna elements is in each case assigned a switching element of the multiple switching elements. A respective switching element is embodied to couple the assigned oscillating circuit antenna element operatively to the antenna arrangement in dependence on a switching status of the switching element. The control apparatus is embodied to measure the symmetry information or homogeneity information of the field distribution in the antenna arrangement and to adjust the multiple switching elements automatically using the measured symmetry information or homogeneity information such that the symmetry or homogeneity of the field distribution in the interior of the antenna arrangement is increased.

The antenna arrangement may further be embodied to carry out the above-described method and therefore also has the advantages described above in connection with the method.

The switching elements may, for example, include diodes, where the switching status may be adjusted by a bias voltage. The bias voltage may be adjusted by the control apparatus. Alternatively or additionally, the switching elements may include transistors that are driven by the control apparatus.

The antenna arrangement may, for example, have a birdcage structure. In an exemplary antenna arrangement, the antenna arrangement includes two ferrules. Each of the ferrules includes in the circumferential direction multiple conductive surfaces that are insulated from one another. Hence, the multiple conductive surfaces are galvanically isolated from one another. One oscillating circuit antenna element out of the multiple oscillating circuit antenna elements may, for example, include a capacitor. The capacitor is arranged between two conductive surfaces of one of the ferrules. For example, the capacitor may be arranged together with assigned switching element between the two conductive surfaces such that, with a closed switching element, a capacitive coupling between the two conductive surfaces is increased by the capacitance of the capacitor. This enables the capacitive coupling between the conductive surfaces of the ferrules to be changed.

The two conductive surfaces of the one of the ferrules may have a capacitive coupling to one another (e.g., due to a geometrical arrangement relative to one another or due to capacitive elements arranged therebetween). The switchable capacitor may have a capacitance in the range of 1% to 20% of the capacitive coupling of the two conductive surfaces. For example, the switchable capacitor may have a capacitance in the range of 5% to 10% of the capacitive coupling of the two conductive surfaces. A change to the capacitive coupling between the two conductive surfaces in the range of, for example, 1% to 20% is generally sufficient to compensate positioning tolerances of the antenna arrangement with respect to, for example, a radio-frequency screen in a magnetic resonance system.

In a further exemplary antenna arrangement, the antenna arrangement includes multiple longitudinal rods. One oscillating circuit antenna element out of the multiple oscillating circuit antenna elements may, for example, include an inductive element. The inductive element is arranged parallel to one out of the multiple longitudinal rods in the longitudinal direction. For example, the inductive element may be arranged together with the assigned switching element parallel to one of the multiple longitudinal rods such that the inductance of the longitudinal rod is increased.

The inductive element may, for example, have an inductance in the range of 1% to 20% of the inductance of the longitudinal rod. For example, the inductive element may have an inductance in the range of 5% to 10% of the inductance of the longitudinal rod. As a result, the inductance of the longitudinal rod may be increased in dependence on a switching status of the switching element by the inductance of the inductive element. Such a change to the inductance of a longitudinal rod in the range of, for example, 1% to 20% is generally sufficient to compensate positioning tolerances of the antenna arrangement with respect to, for example, a radio-frequency screen in a magnetic resonance system.

Also provided in the context of the present embodiments is a magnetic resonance system with an antenna arrangement. The magnetic resonance system may further include, for example, a radio-frequency control apparatus to drive the antenna arrangement, a gradient control unit, an image sequence controller, and a computing unit embodied to acquire MR data for a predetermined volume section within an examination object. The symmetry of a field distribution of the antenna arrangement may be impaired by positional inaccuracy of the antenna arrangement in the magnetic resonance system. The antenna arrangement includes multiple oscillating circuit antenna elements, multiple switching elements, and a control apparatus. Each oscillating circuit antenna element out of the multiple oscillating circuit antenna elements is in each case assigned a switching element of the multiple switching elements. A respective switching element is embodied to couple the assigned oscillating circuit antenna element operatively to the antenna arrangement in dependence on a switching status of the switching element. The control apparatus is embodied to measure the symmetry information or homogeneity information on the field distribution in the antenna arrangement and to adjust the multiple switching elements automatically using the measured symmetry information or homogeneity information such that the symmetry or homogeneity of the field distribution in the interior of the antenna arrangement is increased.

The magnetic resonance system may further be embodied to carry out the above-described method and therefore also has the advantages described above in connection with the method.

The present embodiments also relate to a computer program product (e.g., software or a non-transitory computer-readable storage medium storing programs) that may be loaded directly in a memory of a programmable computing unit of a control apparatus (e.g., a controller) or a magnetic resonance system. The computing unit may include one or more processors in order to process the computer program product.

This computer program product may execute all or some of the above-described embodiments of the method when the computer program product is running in the control apparatus. Herein, the computer program product may require program means (e.g., libraries and auxiliary functions) in order to implement the corresponding embodiments of the method. In other words, the computer program product is, for example, intended to cover software with which one of the above-described embodiments of the method may be carried out or which carries out this embodiment. Herein, the software may be a source code (e.g., C++) that is still to be compiled and linked or only is to be interpreted, or an executable software code that is only to be loaded into the corresponding computing unit for execution.

The present embodiments also relate to an electronically readable data medium (e.g., a non-transitory computer-readable storage medium; a DVD, a magnetic tape, a hard disk, or a USB stick) on which electronically readable control information (e.g., software (see above)) is stored. When this control information (e.g., software) is read from the data medium and stored in a control apparatus or computing unit of a magnetic resonance system, all embodiments of the above-described method may be carried out.

BRIEF DESCRIPTION OF THE DRAWINGS

In the different figures, the same reference characters refer to the same or similar components.

DETAILED DESCRIPTION

Figure 1:
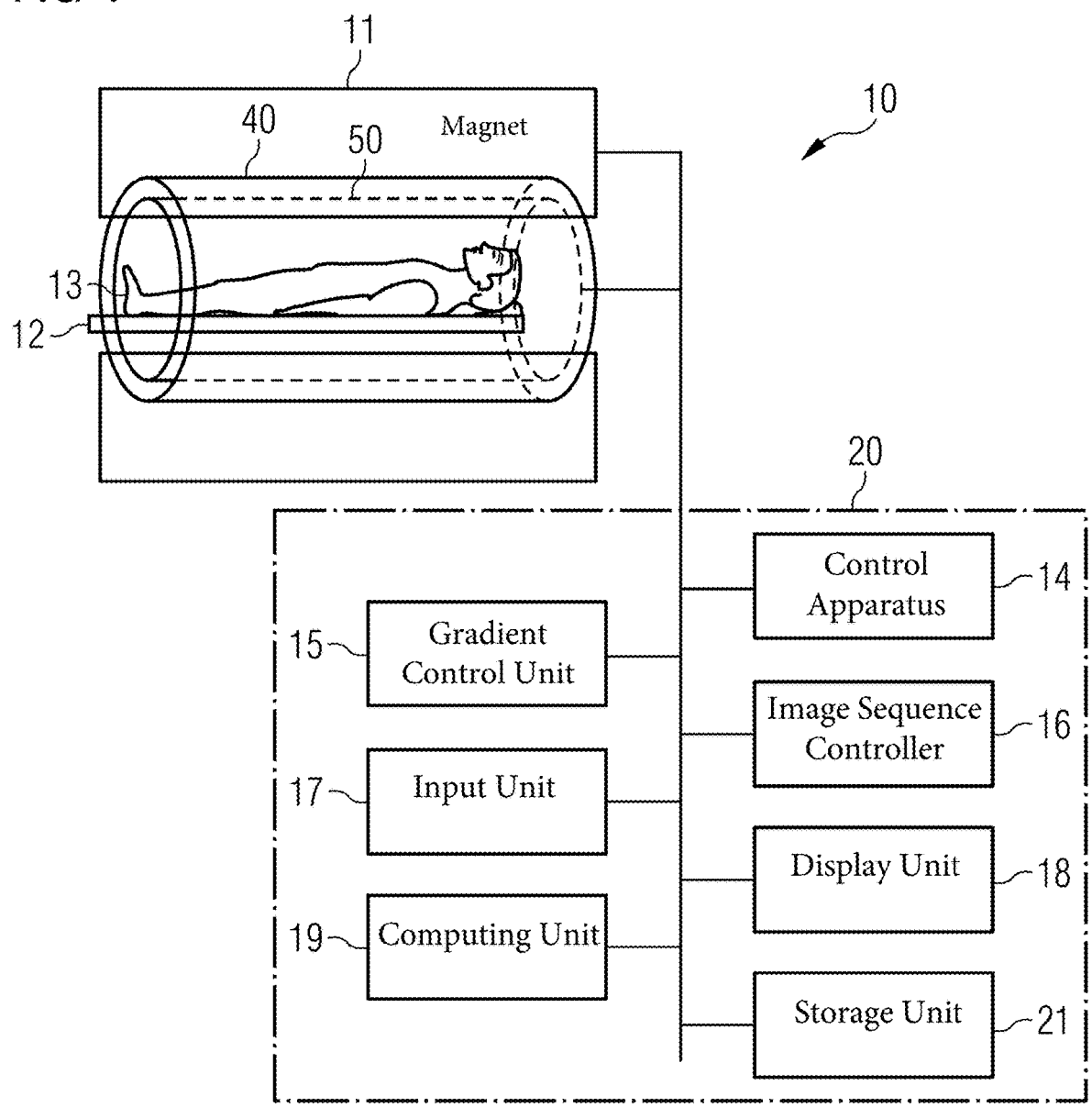
FIG. 1 is a schematic representation of a magnetic resonance system according to one embodiment.

FIG. 1 is a schematic representation of one embodiment of a magnetic resonance (MR) system 10. The magnetic resonance system 10 includes a magnet 11 for the generation of a polarization field B0. A person to be examined 13 lying on a bench 12 may be moved into a cylindrical bore in the magnet 11 for the recording spatially encoded magnetic resonance signals or MR data from the person to be examined 13. A cylindrical antenna arrangement 50 is provided around the cylindrical bore in order to generate radio-frequency signals (e.g., radio-frequency (RF) pulses). To provide a defined environment for field generation by the antenna arrangement 50, a cylindrical radio-frequency screen 40 is provided around the antenna arrangement 50. The irradiation of radio-frequency pulses with the antenna arrangement 50 and switching of magnetic field gradients may cause the magnetization generated by the polarization field B0 to be deflected out of the equilibrium position and spatially encoded, and the resulting magnetization is detected by receiver coils. Methods for generating magnetic resonance (MR) images by irradiating RF pulses and switching magnetic field gradients in different combinations and sequences are in principle known to the person skilled in the art and will not be explained further here.

The magnetic resonance system 10 also includes a controller 20 that may be used to control the magnetic resonance system 10. The controller 20 includes a gradient control unit 15 for controlling and switching the necessary magnetic field gradients. A radio-frequency (RF) control apparatus 14 is provided to control the antenna arrangement 50 and to generate the RF pulses to deflect the magnetization. An image sequence controller 16 controls the sequence of magnetic field gradients and RF pulses and hence, indirectly controls the gradient control unit 15 and the RF control apparatus 14. An operator may control the magnetic resonance system 10 via an input unit 17, and MR images and other information necessary for control may be displayed on a display unit 18. A computing unit 19 with at least one processor unit (not shown) is provided to control the different units in the controller 20 and to carry out computational operations. A storage unit 21, in which, for example, program modules or programs that, when executed by the computing unit 19 or a processor unit of the computing unit 19, may control the sequence of the magnetic resonance system 10 may be stored, is provided. The computing unit 19 is embodied to calculate the MR images from the magnetic resonance signals acquired.

Figure 2:
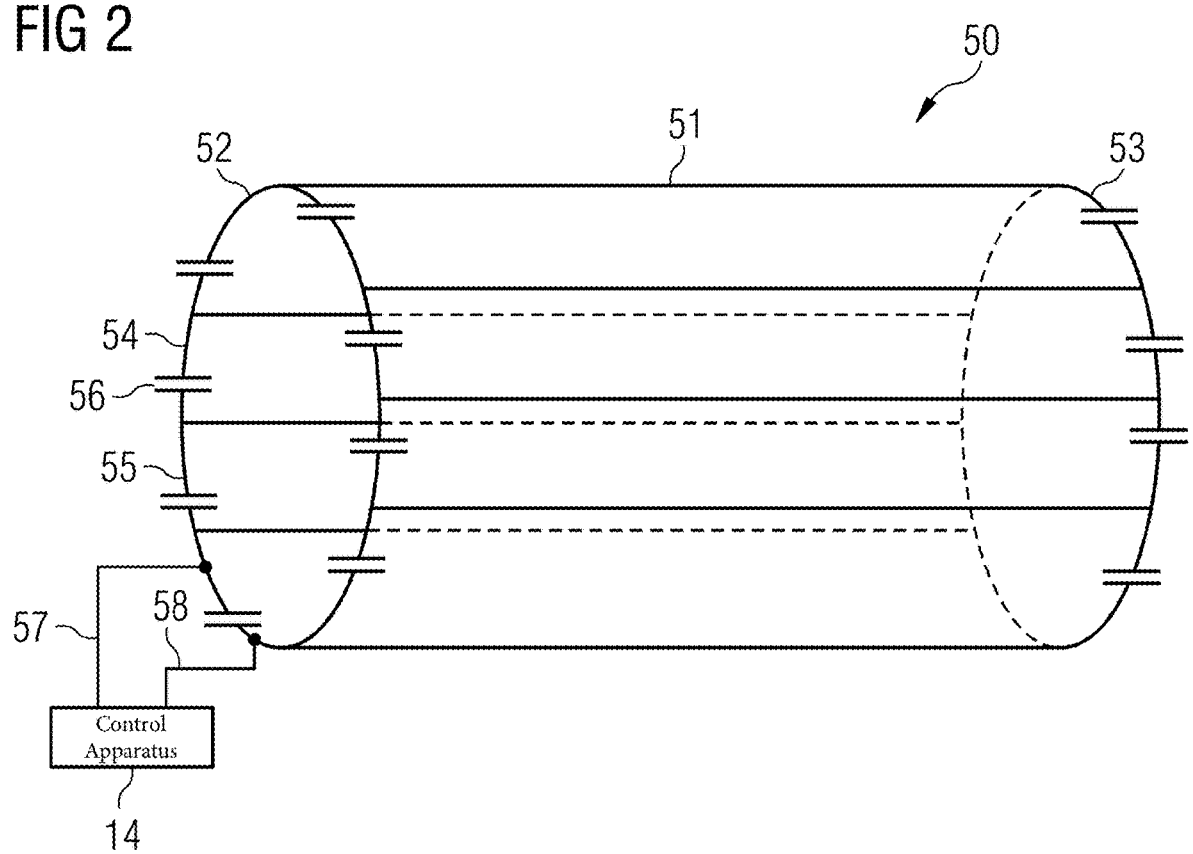
FIG. 2 is a schematic view of an antenna arrangement according to one embodiment.

FIG. 2 shows an exemplary structure of the antenna arrangement 50 in the form of a three-dimensional wire model. The antenna arrangement 50 in FIG. 2 has a birdcage structure. Such a birdcage structure includes a number of equidistant longitudinal antenna rods 51 extending in parallel arranged on a cylindrical surface. In the example in FIG. 2, the antenna arrangement 50 includes eight longitudinal rods 51. However, the antenna arrangement 50 may have any desired number of longitudinal antenna rods 51 (e.g., six or more than eight; twelve or sixteen). These longitudinal rods 51 are in each case connected in terms of radio frequency to one another at corresponding ends by antenna ferrules 52, 53. In this context, "connected in terms of radio frequency" provides that a galvanic connection is not mandatory, but that it is only necessary for a connection that is transparent to radio-frequency currents to exist between the longitudinal rods. For example, resonant capacitors 56 are located in the antenna ferrules 52, 53 in each case between two connection points 54, 55 of adjacent longitudinal antenna rods 51. The connection points 54, 55 may, for example, be formed by conductive surfaces of the respective ferrule 52, 53. The resonant capacitors 56 may, for example, be formed by opposite surfaces of these conductive surfaces 54, 55. Alternatively or additionally, resonant capacitors 56 may be arranged as discrete components between the conductive surfaces. Due to the physical extension, the longitudinal rods 51 each have a corresponding inductance in the longitudinal direction in each case.

In the example shown in FIG. 2, the ferrules 52, 53 are round in each case. Alternatively, the ferrules 52, 53 may also be formed of straight segments running in each case between two longitudinal antenna rods 51.

The antenna arrangement 50 is connected to the radio-frequency control apparatus 14 via connecting leads 57, 58. The connecting leads 57, 58 are in each case connected to adjacent connection points next to a resonant capacitor 56. These connecting leads 57, 58 are used not only to feed the radio-frequency pulses during transmission, but also to tap the captured magnetic resonance signals during transmission.

A precise arrangement of, or precise interaction between, the antenna arrangement 50 and the radio-frequency screen 40 is decisive for optimum performance of the antenna arrangement 50. A precise arrangement of the antenna arrangement 50 in the radio-frequency screen 40 (e.g., a uniform distance between the antenna arrangement 50 and the radio-frequency screen 40) is inter alia decisive for the homogeneity or symmetry of a radio-frequency field generated by the antenna arrangement 50. A resonant frequency or multiple resonant frequencies and the decoupling thereof in the antenna arrangement 50 may be influenced by the arrangement of the antenna arrangement 50 in the radio-frequency screen 40. Hence, the performance of the antenna arrangement 50 may be impaired by mechanical tolerances on the installation of the antenna arrangement 50. In addition, the performance of the antenna arrangement 50 during the operation of the magnetic resonance system 10 may be impaired by, for example, the arrangement of the patient 13 within the antenna arrangement 50 since a field distribution of the field generated by the antenna arrangement 50 may be influenced by the patient 13.

For example, the antenna arrangement 50 includes switchable oscillating circuit antenna elements in order to compensate the mechanical tolerances.

Figure 3:
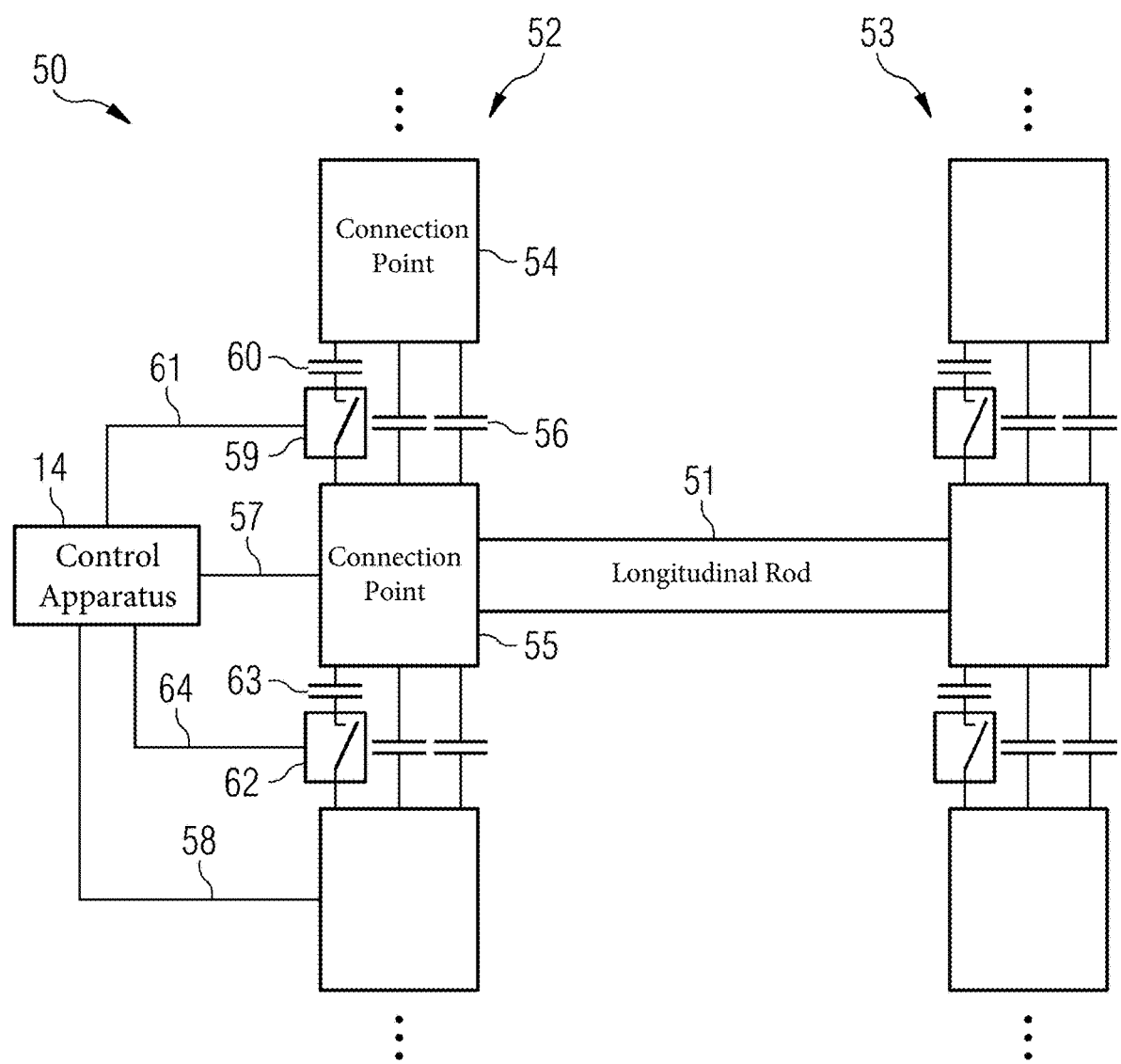
FIG. 3 is a schematic view of a section of an antenna arrangement according to one embodiment.

FIG. 3 shows a section of the antenna arrangement 50 in FIG. 2. FIG. 3 shows only some of the connection points 54, 55 of the ferrules 52, 53 and only one longitudinal antenna rod 51 out of the multiple longitudinal antenna rods. In the example in FIG. 3, in each case two resonant capacitors 56 are shown between in each case two adjacent connection points 54, 55. The number of these resonant capacitors 56 between two adjacent connection points 54, 55 in each case is arbitrary. As described above, the capacitance of these resonant capacitors 56 may also, for example, be generated by the actual connection points 54, 55. As shown in FIG. 3, the connection points 54, 55 may include conductive surfaces lying opposite one another on one side. The conductive surface lying opposite one another are able to form a capacitance. The conductive surfaces 54, 55 are conductively connected to the longitudinal rod 51, where the longitudinal rod 51 may be embodied as a conductive surface.

FIG. 3 shows combinations of a switching element and a capacitor as switchable oscillating circuit antenna elements. For example, a switching element 59 is provided in series with a capacitor 60 between the conductive surface 54 and the conductive surface 55 as a switchable oscillating circuit antenna element. On the other side of the conductive surface 55, a series circuit of a switching element 62 and a capacitor 63 is provided as a switchable oscillating circuit antenna element for the adjacent conductive surface there. Corresponding switchable oscillating circuit antenna elements are also provided between the conductive surfaces at the ferrule 53. In the closed status of the switching element 59, the capacitance of the capacitor 60 also acts on the capacitive coupling between the conductive surface 54 and the conductive surface 55. The switching elements 59, 62 may be controlled by the control apparatus 14. For this, a control line 61 is provided between the control apparatus 14 and the switching element 59, and a control line 64 is provided between the control apparatus 14 and the switching element 62.

The switchable oscillating circuit antenna elements may be used to adjust the field distribution in the interior of the antenna arrangement 50 in order, for example, to increase the symmetry or homogeneity of the field distribution and hence to compensate mechanical tolerances for the positioning of the antenna arrangement 50 in the radio-frequency screen 40. A satisfactory adjustment of the field distribution may be achieved in the interior of the antenna arrangement 50 with only a few switchable oscillating circuit antenna elements. For example, only two to four switchable oscillating circuit antenna elements may be provided in each of the ferrules 52, 53. A respective switchable oscillating circuit antenna element may be provided in each of the ferrules 52, 53 between each of the connection points 54, 55.

Figure 4:
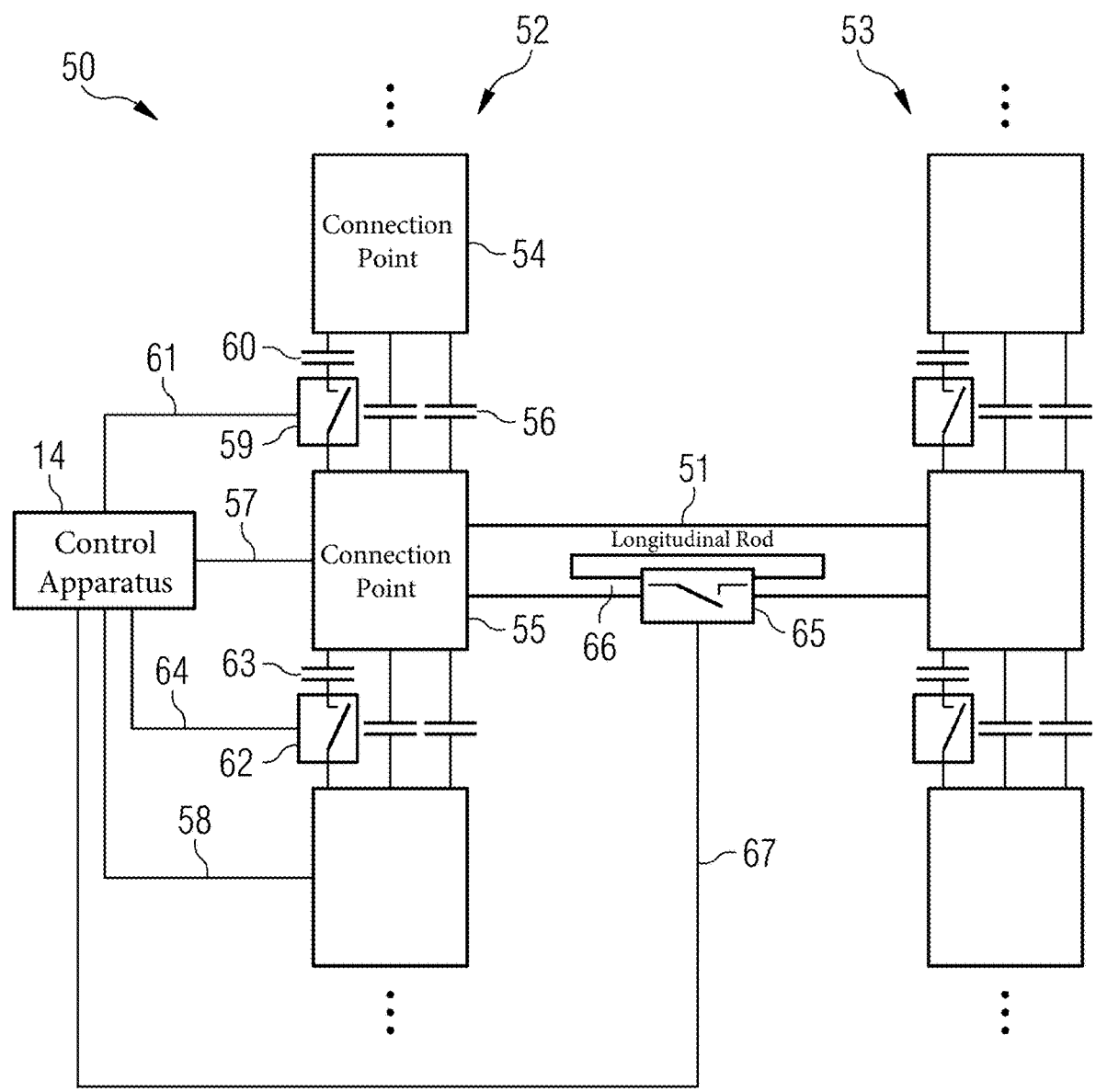
FIG. 4 is a schematic view of a section of an antenna arrangement according to a further embodiment.

FIG. 4 shows a further example of a switchable oscillating circuit antenna element. The switchable oscillating circuit antenna element in FIG. 4 includes a combination of a switching element 65 and an inductive element 66. The inductive element 66 may, for example, be a conductor trace or a flat conductor parallel to the longitudinal rod 51. In closed status of the switching element 65, the inductance of the inductive element 66 also acts on the inductance of the longitudinal antenna rod 51. The switching element 65 may be controlled by the control apparatus 14. For this, a control line 67 is provided between the control apparatus 14 and the switching element 65. In one embodiment, multiple such switchable oscillating circuit antenna elements are provided in one longitudinal antenna rod 51.

The switchable oscillating circuit antenna elements in the longitudinal antenna rod 51 may be used to adjust the field distribution in the interior of the antenna arrangement 50 in order, for example, to increase the symmetry or homogeneity of the field distribution and hence to compensate mechanical tolerances for the positioning of the antenna arrangement 50 in the radio-frequency screen 40. A satisfactory adjustment of the field distribution in the interior of the antenna arrangement 50 may be achieved with only a few switchable oscillating circuit antenna elements. For example, a respective switchable oscillating circuit antenna element may be provided in only a few of the longitudinal antenna rods 51 (e.g., in only two or four of the longitudinal antenna rods 51). A corresponding switchable oscillating circuit antenna element may be provided in each of the longitudinal rods 51.

The oscillating circuit antenna elements between the conductive surfaces 54, 55 and in the longitudinal antenna rods 51 may be driven independently of one another by the control apparatus 14.

The above-described switchable oscillating circuit antenna elements in the antenna arrangement 50 may, for example, compensate mechanical tolerances resulting from the interaction between the radio-frequency screen 40 and the antenna arrangement 50. These switchable oscillating circuit antenna elements may be used to adjust resonant frequencies and the decoupling thereof. The resonant frequencies and the decoupling thereof may, for example, be measured with the radio-frequency control apparatus 14 while the antenna arrangement 50 is driven and the switchable oscillating circuit antenna elements are driven correspondingly in order to achieve suitable target values for the resonant frequencies and the decoupling thereof. Herein, the switchable oscillating circuit antenna elements may be driven, for example, by an optimization method (e.g., by a gradient descent method) in order to adjust desired resonant frequencies and the decoupling thereof. Alternatively, it is also possible to try out all possible switch combinations of the switchable oscillating circuit antenna elements and to select the most suitable switching combination for the operation.

Figure 5:
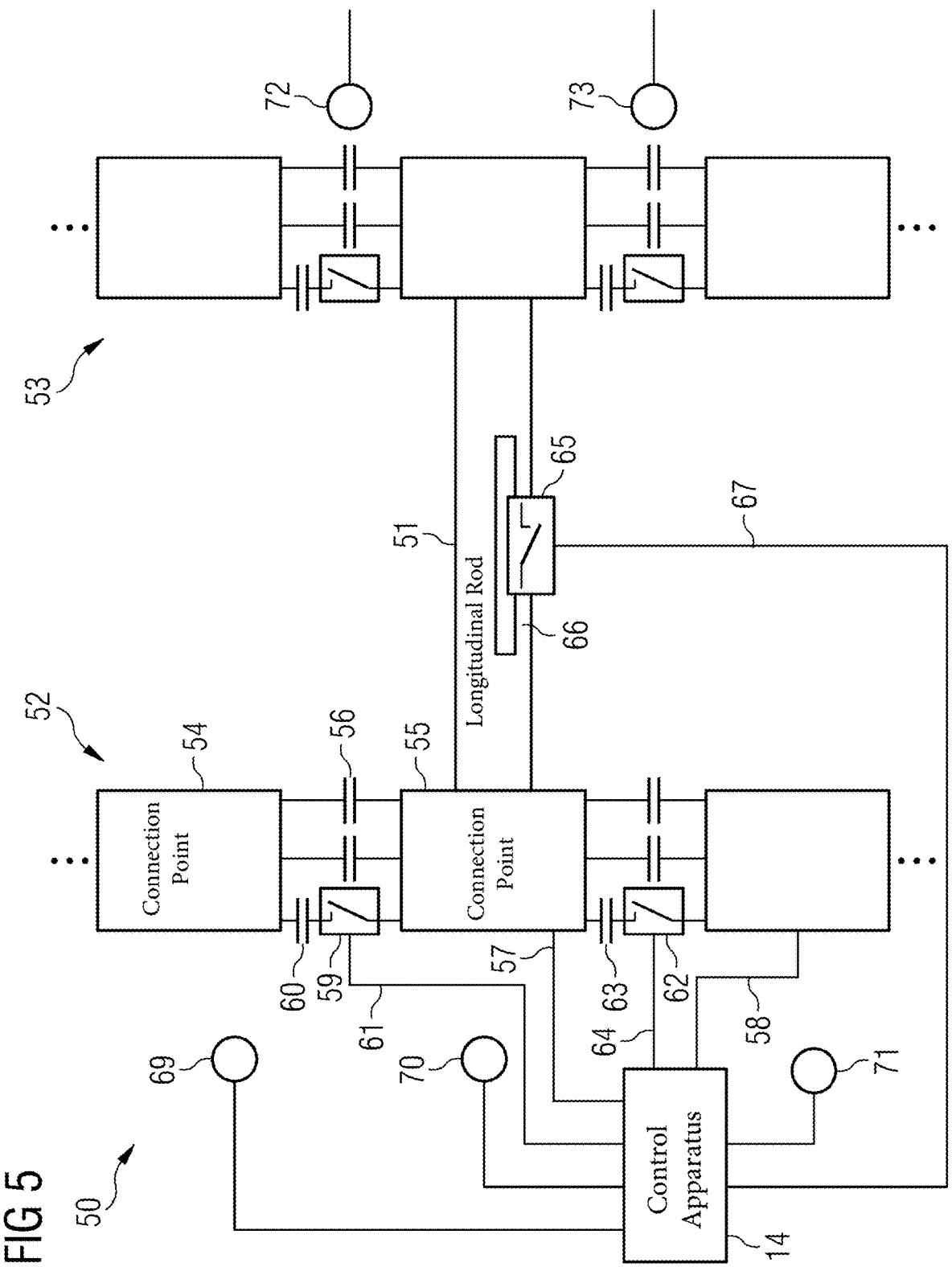
FIG. 5 is a schematic view of a section of an antenna arrangement according to a further embodiment.

In addition to the resonant frequencies and the decoupling, a current distribution in the antenna arrangement 50 may, for example, also be used as an optimization criterion. For this, a current sensor may be assigned to each switching element. FIG. 5 shows such an arrangement in which a corresponding current sensor 72, 73 is in each case assigned to the switching elements in the ferrule 53. Alternatively or additionally, current sensors may be provided to measure a current in the connection points 54, 55. FIG. 5 shows, for example, current sensors 69-71 for measuring respective currents in the connection points 54, 55 in the ferrule 53. The current sensors 69-73 may be coupled to the radio-frequency control apparatus 14. The current sensors 69-73 may in each case include a pick-up coil. Taking account of the information from the current sensors 69-73, the switchable oscillating circuit antenna elements may be adjusted such that a homogeneous current distribution and hence also a homogeneous field distribution is achieved. This enables effects of asymmetries during installation to be at least partially compensated. If, for example, the antenna arrangement 50 is not placed in the center of the radio-frequency screen 40, this may result in asymmetry in the B1 field in the transverse direction. This asymmetry may be compensated by driving the switchable oscillating circuit antenna elements in a suitable manner. It is evident that it is not necessary to provide a corresponding current sensor in the region of each switchable oscillating circuit antenna element and each connection point in order to achieve a more homogeneous current distribution. It is possible for asymmetries and inhomogeneities to be at least partially acquired and hence compensated with a lower number of current sensors.

In one embodiment, the switchable oscillating circuit antenna elements may be driven by the radio-frequency control apparatus 14 during the operation of the magnetic resonance system 10 (e.g., when a patient 13 is moved into the magnetic resonance system 10) in order to compensate impacts of the patient 13 on the current distribution in the antenna arrangement 50. For this, it is, for example, again possible to use the above-described current sensors. Alternatively or additionally, in addition to the current sensors, it is also possible to use sensors for the measurement of the B1 field at different locations for the evaluation of the B1 field and the adjustment of the switchable oscillating circuit antenna elements. For example, the B1 field may be measured with permanently installed sensors or with mobile sensors at specific locations and a B1-map generated. This B1 map may be used as the basis for the evaluation of the B1 field distribution by the radio-frequency control apparatus 14 and for driving the switchable oscillating circuit antenna elements correspondingly in order to improve the B1 field.

To summarize, the switchable oscillating circuit antenna elements may be used to compensate mechanical tolerances and corresponding influence of the tuning of the antenna arrangement 50 in an automated and inexpensive manner.

Figure 6:
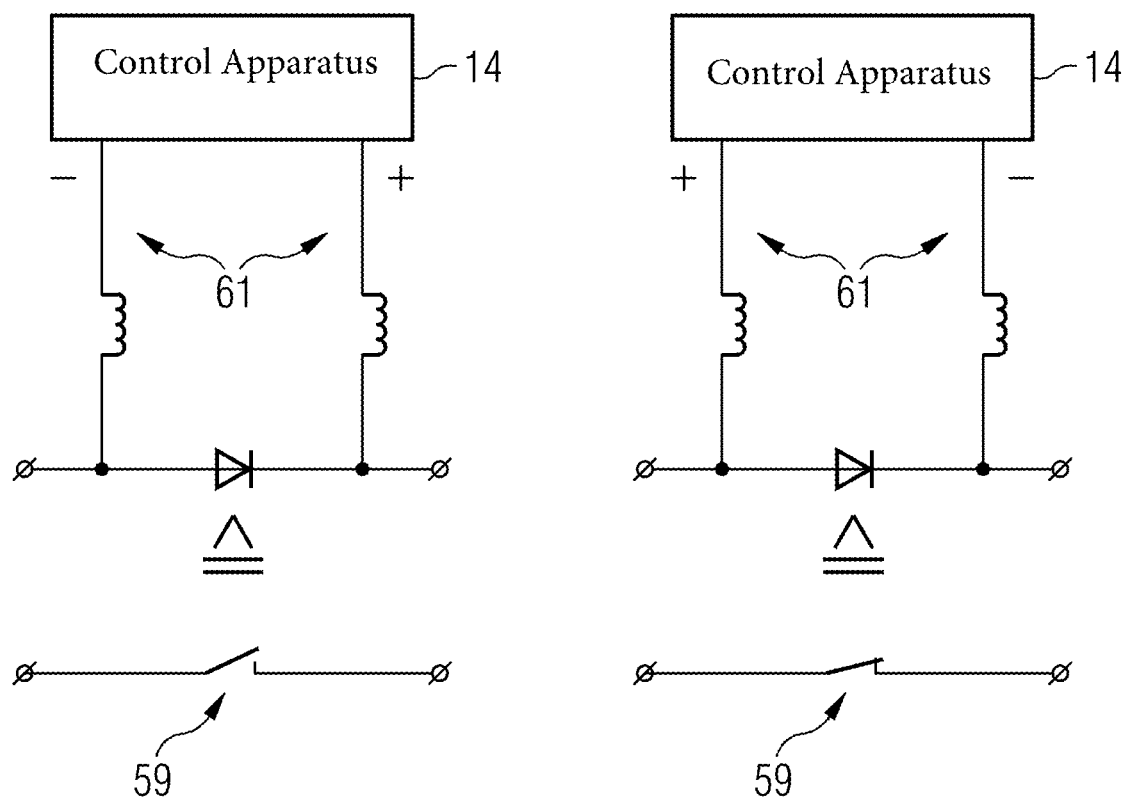
FIG. 6 is a schematic view of a switching element with a drive according to one embodiment.

FIG. 6 is a schematic view of an example of a switching element (e.g., the switching element 59). In the example shown in FIG. 6, the switching element includes a diode. The diode may, for example, be a PIN diode. Alternatively or additionally, other switchable semiconductor elements may be used as switching elements (e.g., transistors).

The switching elements 59, 62, 65 in the ferrules 52, 53 and the longitudinal antenna rods 51 may be switched on and off individually separately from one another via corresponding control lines. On the left side of FIG. 3, the control apparatus 14 applies a voltage that is negative with respect to the cathode, to the anode of the diode via the control lines 61. As a result, the diode blocks and the switching element 59 is not permeable for radio-frequency currents; hence, the switching element 59 is "open". On the right side of FIG. 3, the control apparatus 14 applies a voltage that is positive with respect to the cathode, to the anode of the diode via the control lines 61. As a result, the diode conducts and the switching element 59 is permeable for radio-frequency currents; hence, the switching element 59 is "closed".

Figure 7:
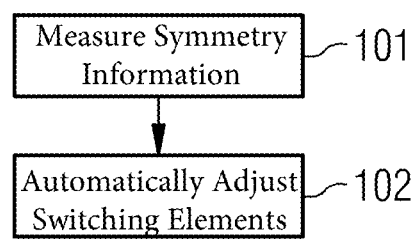
FIG. 7 is a schematic view of a flowchart with method acts of a method according to one embodiment.

FIG. 7 depicts a flowchart of a method with steps 101 and 102. The method may, for example, be carried out by the radio-frequency control apparatus 14.

In act 101, the symmetry information on the field distribution in the antenna arrangement 50 is measured. The symmetry information may, for example, indicate a measure for the homogeneity or symmetry of a B1 field generated by the antenna arrangement 50. For the determination of the symmetry information, for example, a current distribution in the antenna arrangement 50, resonant frequencies and the decoupling thereof during the feeding of radio-frequency signals into the antenna arrangement 50, or the B1 field generated by the antenna arrangement 50 may be measured at different positions. In act 102, the multiple switching elements 59, 62, 65 in the ferrules 52, 53 and in the longitudinal antenna rods 51 are automatically adjusted using the measured symmetry information such that the symmetry of the field distribution in the interior of the antenna arrangement 50 is increased. Method acts 101 and 102 may be carried out interactively several times in order to achieve optimization of the symmetry of the field distribution in the interior of the antenna arrangement 50.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for adjusting a field distribution of an antenna arrangement of a magnetic resonance system, wherein a symmetry of the field distribution is impaired by positional inaccuracy of the antenna arrangement in the magnetic resonance system, wherein the antenna arrangement comprises multiple oscillating circuit antenna elements and multiple switching elements, wherein each of the multiple oscillating circuit antenna elements is assigned a respective switching element of the multiple switching elements, wherein a respective switching element is configured to couple the assigned oscillating circuit antenna element operatively to the antenna arrangement in dependence on a switching status of the respective switching element, the method comprising:

measuring symmetry information on the field distribution in the antenna arrangement; and automatically adjusting the multiple switching elements using the measured symmetry information such that the symmetry of the field distribution in an interior of the antenna arrangement is increased.

2. The method of claim 1, wherein the positional inaccuracy of the antenna arrangement includes positional inaccuracy of an arrangement of the antenna arrangement relative to a radio-frequency screen, and wherein the adjustment of the multiple switching elements such that the symmetry of the field distribution in the interior of the antenna arrangement is increased at least partially compensates the positional inaccuracy.

3. The method of claim 1, wherein measuring the symmetry information comprises measuring a resonant frequency of the antenna arrangement, and wherein automatically adjusting the multiple switching elements comprises automatically adjusting the multiple switching elements using the resonant frequency such that the symmetry of the field distribution in the interior of the antenna arrangement is increased.

4. The method of claim 1, wherein measuring the symmetry information comprises measuring a B1 field in the antenna arrangement, and wherein automatically adjusting the multiple switching elements comprises automatically adjusting the multiple switching elements using the B1 field measurement such that the symmetry of the field distribution in the interior of the antenna arrangement is increased.

5. The method of claim 1, wherein measuring the symmetry information includes measuring a current distribution in the antenna arrangement, wherein automatically adjusting the multiple switching elements comprises automatically adjusting the multiple switching elements using the current distribution such that the symmetry of the field distribution in the interior of the antenna arrangement is increased.

6. The method of claim 1, wherein one oscillating circuit antenna element of the multiple oscillating circuit antenna elements comprises a capacitor, and wherein the method further comprises:
coupling the capacitor to the antenna arrangement by the assigned switching element to change a capacitance of the antenna arrangement, such that the symmetry of the field distribution in the antenna arrangement is increased.

7. The method of claim 1, wherein one oscillating circuit antenna element of the multiple oscillating circuit antenna elements comprises an inductive element, and wherein the method further comprises:
coupling the inductive element by the assigned switching element to the antenna arrangement to change an inductance of the antenna arrangement, such that the symmetry of the field distribution in the antenna arrangement is increased.

8. The method of claim 1, wherein the multiple switching elements are switchable independently of one another.

9. An antenna arrangement for a magnetic resonance system, the antenna arrangement comprising:

multiple oscillating circuit antenna elements;

multiple switching elements, wherein each of the multiple oscillating circuit antenna elements is assigned a respective switching element of the multiple switching elements, wherein a respective switching element is configured to couple the assigned oscillating circuit antenna element operatively to the antenna arrangement in dependence on a switching status of the respective switching element; and a controller configured to:
measure symmetry information on the field distribution in the antenna arrangement; and
automatically adjust the multiple switching elements using the measured symmetry information such that the symmetry of the field distribution in the interior of the antenna arrangement is increased.

10. The antenna arrangement of claim 9, wherein the measurement of the symmetry information comprises measurement of a resonant frequency of the antenna arrangement, and
wherein the automatic adjustment of the multiple switching elements comprises automatic adjustment of the multiple switching elements using the resonant frequency such that the symmetry of the field distribution in the interior of the antenna arrangement is increased.

11. The antenna arrangement of claim 9, further comprising two ferrules,
wherein each of the two ferrules comprises, in a circumferential direction, multiple conductive surfaces that are insulated from one another,
wherein one oscillating circuit antenna element of the multiple oscillating circuit antenna elements comprises a capacitor, and
wherein the capacitor is arranged between two conductive surfaces of the multiple conductive surfaces of one of the two ferrules.

12. The antenna arrangement of claim 11, wherein the two conductive surfaces of the one ferrule comprise a capacitive coupling to one another, and
wherein the capacitor has a capacitance in a range of 1% to 20% of the capacitive coupling of the two conductive surfaces.

13. The antenna arrangement of claim 12, wherein the range is 5% to 10% of the capacitive coupling of the two conductive surfaces.

14. The antenna arrangement of claim 9, further comprising multiple longitudinal rods,
wherein one oscillating circuit antenna element of the multiple oscillating circuit antenna elements comprises an inductive element, and
wherein the inductive element is arranged parallel to one of the multiple longitudinal rods in a longitudinal direction.

15. The antenna arrangement of claim 14, wherein the one longitudinal rod has an inductance, and
wherein the inductive element has an inductance in a range of 1% to 20% of the inductance of the one longitudinal rod.

16. The antenna arrangement of claim 15, wherein the range is 5% to 10% of the inductance of the longitudinal rod.

17. A magnetic resonance system comprising:
an antenna arrangement comprising:
multiple oscillating circuit antenna elements;
multiple switching elements, wherein each of the multiple oscillating circuit antenna elements is assigned a respective switching element of the multiple switching elements, wherein a respective switching element is configured to couple the assigned oscillating circuit antenna element operatively to the antenna arrangement in dependence on a switching status of the respective switching element; and
a controller configured to:
measure symmetry information on the field distribution in the antenna arrangement; and
automatically adjust the multiple switching elements using the measured symmetry information such that the symmetry of the field distribution in the interior of the antenna arrangement is increased.

18. In a non-transitory computer-readable medium that stores instructions executable by a controller of a magnetic resonance system to adjust a field distribution of an antenna arrangement of the magnetic resonance system, wherein a symmetry of the field distribution is impaired by positional inaccuracy of the antenna arrangement in the magnetic resonance system, wherein the antenna arrangement comprises multiple oscillating circuit antenna elements and multiple switching elements, wherein each of the multiple oscillating circuit antenna elements is assigned a respective switching element of the multiple switching elements, wherein a respective switching element is configured to couple the assigned oscillating circuit antenna element operatively to the antenna arrangement in dependence on a switching status of the respective switching element, the instructions comprising:
measuring symmetry information on the field distribution in the antenna arrangement; and
automatically adjusting the multiple switching elements using the measured symmetry information such that the symmetry of the field distribution in an interior of the antenna arrangement is increased.

* * * * *